United States Patent
Cortellini et al.

(10) Patent No.: US 8,664,135 B2
(45) Date of Patent: Mar. 4, 2014

(54) CRUCIBLE BODY AND METHOD OF FORMING SAME

(75) Inventors: Edmund A. Cortellini, North Brookfield, MA (US); Christopher J. Reilly, Whitinsville, MA (US); Vimal K. Pujari, Northborough, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 13 days.

(21) Appl. No.: 13/338,904

(22) Filed: Dec. 28, 2011

(65) Prior Publication Data

US 2012/0208690 A1    Aug. 16, 2012

Related U.S. Application Data

(60) Provisional application No. 61/428,312, filed on Dec. 30, 2010.

(51) Int. Cl.
  *C30B 11/00* (2006.01)
  *C04B 35/597* (2006.01)
  *C04B 35/584* (2006.01)

(52) U.S. Cl.
  USPC .......... 501/96.5; 501/97.1; 117/213; 432/264

(58) Field of Classification Search
  USPC ................. 501/96.5, 97.1; 117/213; 432/265
  See application file for complete search history.

(56) References Cited

U.S. PATENT DOCUMENTS

| | | | |
|---|---|---|---|
| 2,968,530 A | 1/1961 | Forgeng et al. | |
| 3,356,513 A * | 12/1967 | Washburn | 501/96.5 |
| 4,043,823 A | 8/1977 | Washburn et al. | |
| 4,069,058 A | 1/1978 | Washburn | |
| 4,099,924 A | 7/1978 | Berkman et al. | |
| 4,331,771 A | 5/1982 | Washburn | |
| 4,356,152 A | 10/1982 | Berkman et al. | |
| 4,519,966 A * | 5/1985 | Aldinger et al. | 264/633 |
| 4,581,295 A * | 4/1986 | DeLiso et al. | 428/446 |
| 4,755,220 A * | 7/1988 | Woditsch et al. | 75/233 |
| 4,990,469 A | 2/1991 | Dussaulx et al. | |
| 5,389,587 A * | 2/1995 | Nakashima et al. | 501/96.4 |
| 5,510,304 A * | 4/1996 | Willkens | 501/97.4 |
| 5,607,775 A * | 3/1997 | Kimura et al. | 428/461 |
| 2004/0211496 A1 | 10/2004 | Khattak et al. | |
| 2008/0260608 A1* | 10/2008 | Rancoule | 422/245.1 |
| 2008/0292524 A1* | 11/2008 | Rancoule | 423/349 |
| 2009/0277377 A1 | 11/2009 | Ohashi et al. | |
| 2009/0312173 A1 | 12/2009 | Levoy et al. | |

FOREIGN PATENT DOCUMENTS

| | | | |
|---|---|---|---|
| JP | 54157779 | * | 12/1979 |
| JP | 2010030851 A | | 2/2010 |
| JP | 2010208866 A | | 9/2010 |

OTHER PUBLICATIONS

P. Boch et al., "Elastic properties of silicon oxynitride," Journal of Materials Science, vol. 14, Chapman and Hall, Ltd., Printed in Great Britain, dated 1979, pp. 379-385.

(Continued)

*Primary Examiner* — Karl Group
(74) *Attorney, Agent, or Firm* — Robert N. Young; Abel Law Group, LLP

(57) ABSTRACT

An article including a monolithic crucible body comprising silicon oxynitride ($Si_xN_yO$, wherein $x>0$ and $y>0$), wherein the silicon oxynitride extends throughout the entire volume of the monolithic crucible body.

16 Claims, 2 Drawing Sheets

(56) References Cited

OTHER PUBLICATIONS

T.N. Zabruskova et al., "Some Properties of Silicon Oxynitride Refractories," UDC 666.764.52, Moscow D. I. Mendeleev Institute of Chemical Technology, Translated from Ogneupory, No. 4, pp. 55-59, Apr. 1971, <http://resources.metapress.com/pdf-preview.axd?code=m1796750405 . . . >, printed Jul. 12, 2010, 1 pages.

The International Search Report and the Written Opinion received for International Application No. PCT/US2011/067581 from the International Searching Authority (ISA/KR), dated Oct. 8, 2012, 10 pages.

\* cited by examiner

CRUCIBLE BODY AND METHOD OF FORMING SAME

CROSS-REFERENCE TO RELATED APPLICATION

This application claims priority under 35 U.S.C. §119(e) to U.S. Patent Application No. 61/428,312 entitled "Crucible Body and Method of Forming Same," by Cortellini et al., filed Dec. 30, 2010, which is assigned to the current assignee hereof and incorporated herein by reference in its entirety.

BACKGROUND

1. Field of the Disclosure

The following is directed to crucibles, and more particularly, a crucible having a monolithic body comprising silicon oxynitride.

2. Description of the Related Art

Certain processes of forming single crystal materials require vessels or crucibles to contain a significant quantity of molten material, while the crystal forming process is completed. For example, the Czochralski process pulls and forms a crystalline material from a crucible containing the melted material, wherein during the pulling process, the material is solidified and crystallized into an ingot, or large crystalline mass that can be further processed. In fact, silicon ingots are generally formed using one of three methods: (1) pulling an ingot from melt, (e.g., the Czochralski process); (2) solidifying a melt in a crucible by directional solidification techniques; or (3) pouring a melt from a crucible into a mold using casting techniques.

In a directional solidification process, silicon is typically melted in the crucible and directionally solidified in the same crucible. In this case, there is contact between the silicon melt and the crucible, as well as contact between the solidified silicon ingot and the crucible. In a casting process, the silicon is melted in a crucible and the melt is then poured from the crucible into a mold, where the silicon solidifies. The casting process can have contact between the melt and the crucible, the melt and the mold (although minimal), and the mold and the solidified ingot.

Still, a host of problems plague the industry when using crucibles in such capacities, including for example, particle generation and contamination concerns from the crucible, chemical reactions between the melt material and the crucible, proper wetting characteristics between the crucible and the melt material, release of solidified material from the crucible, thermal shock and cracking of the crucibles. In fact, it is a typical industry practice to use the crucible once to form a single ingot, and discard the crucible because it is destroyed or significantly compromised.

Silica remains the material of choice for crucible and mold applications because it is readily available in high purity form, and minimizes contamination in processing of silicon ingots. Moreover, such conventional quartz crucibles may have coatings of silicon nitride. Still, such conventional constructions are still subject to the problems noted above.

The industry continues to demand improved crucibles for holding melt materials and improving processes for forming single crystal materials.

SUMMARY

According to one aspect, a method of forming a ceramic article includes forming a mixture comprising silicon oxynitride ($Si_xN_yO$, wherein x>0 and y>0), and shaping the mixture into a crucible body wherein the silicon oxynitride extends throughout the entire volume of the monolithic crucible body.

In another aspect, an article includes a crucible body having a monolithic construction and a crucible coefficient of thermal expansion ($CTE_c$), the crucible body having a difference in coefficient of thermal expansion ($\Delta CTE$) between the $CTE_c$ and a coefficient of thermal expansion of metal silicon ($CTE_S$) defined by the equation $\Delta CTE=[(CTEc-CTEs)/CTEs]$ of not greater than about 20%.

In still another aspect, an article includes a monolithic crucible body comprising silicon oxynitride ($Si_xN_yO$, wherein x>0 and y>0), wherein the silicon oxynitride extends throughout the entire volume of the monolithic crucible body.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

The following is directed to ceramic articles, which may be suitable for use in processing of other materials. In particular, the following is directed to ceramic articles in the form of crucible bodies, which may be suitable for use in processing and containing materials during high temperature processing. For example, the crucibles as described herein may be suitable for holding molten material, such as molten silicon, used in forming single crystal ingots of materials suitable for forming products in the electronics industry, optical industry, renewable energy industry, and the like. In particular instances, the crucibles can facilitate processing of molten silicon used to form semiconductor components and electronic devices, such as solar cells.

Figure 1:
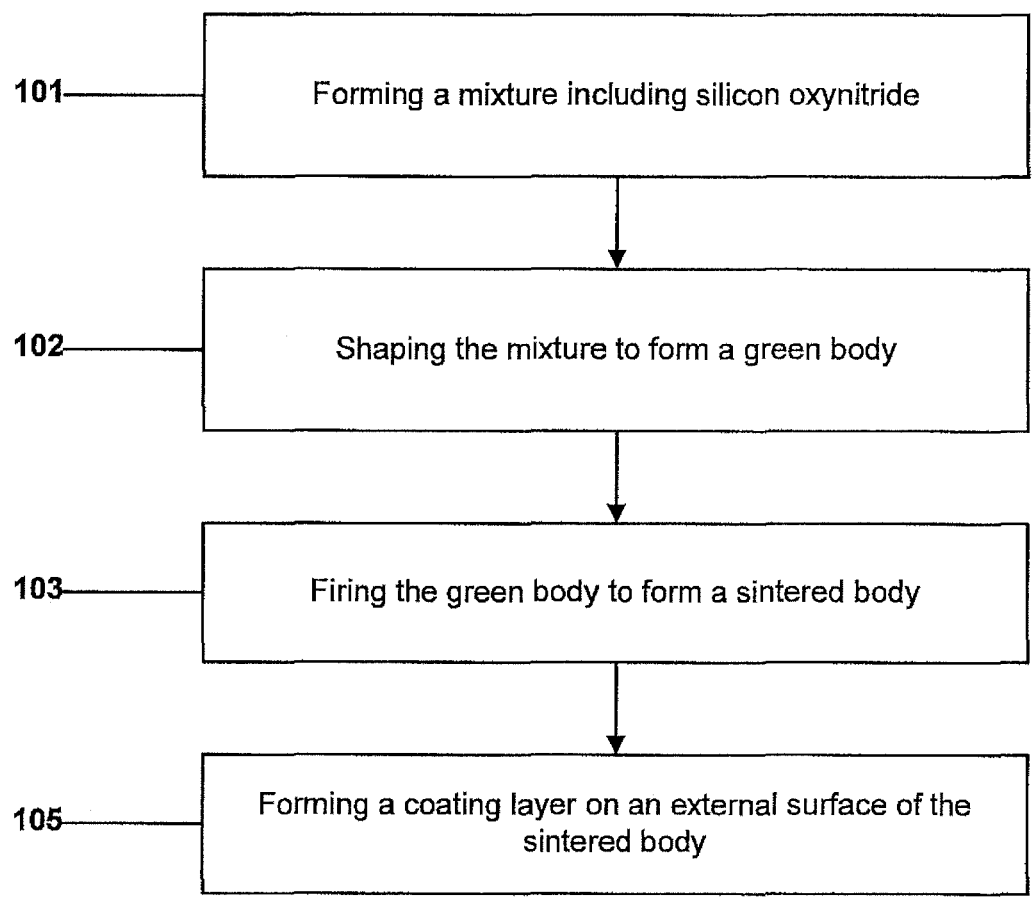
FIG. 1 includes a flow chart illustrating a process of forming an article in accordance with an embodiment.

FIG. 1 includes a flow chart providing a process for forming an article in accordance with an embodiment. The process of forming an article can be initiated at step 101 by forming a mixture comprising silicon oxynitride, represented by the formula $Si_xN_yO$, wherein x>0 and y>0. In certain instances, the mixture can be a dry mixture of powder components. As such, at least one of the powder components can include silicon oxynitride. In particular, one of the powder components can consist essentially of a silicon oxynitride, such that the powder is a silicon oxynitride powder material.

In accordance with an embodiment, the mixture can be formed such that it includes a coarse powder component and a fine powder component. In forming the mixture comprising the coarse powder component and fine powder component, certain mixtures may include substantially equal amounts of the fine powder and coarse powder component. That is, the mixture can include a blend of 50/50 (by wt %) of the fine powder component and coarse powder component. Still, in other instances the mixture can contain a majority amount of one of the fine powder component or coarse powder component.

The coarse powder component can have an average particle size that is significantly greater than an average particle size of the fine powder component. For example, the coarse powder component can have an average particle size of at least about 40 microns. In other embodiments, the average particle size of the coarse particle component can be greater, such as at least about 50 microns, at least about 60 microns, at least about 70 microns, or even at least about 80 microns. Still, the average particle size of the coarse powder component can be limited, such that it may be not greater than about 200 microns, not greater than about 150 microns, not greater than about 125 microns, or even not greater than 100 microns. It will be appreciated that the coarse powder component can have an average particle size within a range between any of the minimum and maximum values noted above.

The fine powder component can have an average particle size that is significantly less than the average particle size of the coarse powder component. For example, in certain embodiments, the particle size of the fine powder component can be not greater than about 30 microns. In other instances, the average particle size of the fine powder component can be not greater than about 25 microns, such as not greater than about 20 microns, not greater than about 15 microns, not greater than about 10 microns, or even not greater than about 8 microns. In certain instances, the fine powder component can have an average particle size that is at least about 0.01 microns, such as at least about 0.1 microns, or even at least about 0.5 microns. It will be appreciated that the fine particle component can have an average particle size within a range between any of the minimum and maximum values above.

In accordance with an embodiment, the coarse powder component can include a material selected from the group consisting of silicon nitride, silicon carbide, silicon oxynitride, silicon metal, and a combination thereof. The mixture of one particular embodiment utilizes a coarse powder component including silicon oxynitride powder. In certain instances, the coarse powder component can contain a majority content of silicon oxynitride powder. Still, certain processes may utilize a coarse powder component that consists essentially of silicon oxynitride material, such that the coarse powder component is entirely a silicon oxynitride powder.

The coarse powder component can include a certain content of an additional powder material in addition to the silicon oxynitride powder. For example, the coarse powder component can include a mixture of a coarse-sized silicon oxynitride powder material and one or more of a coarse-sized silicon nitride powder, coarse-sized silicon carbide powder, coarse-sized silicon dioxide powder, or coarse-sized silicon metal powder. The mixture can contain equal amounts of the silicon oxynitride powder and any of the other coarse-sized additions (i.e., coarse-sized silicon nitride powder, coarse-sized silicon carbide powder, or coarse-sized silicon metal powder). In particular instances, the coarse-sized additions can be present in a minor amount, such that the coarse powder component comprises a majority content (wt % of the total weight of the mixture) of the silicon oxynitride powder material.

The fine powder component can include a material such as carbides, oxides, nitrides, silicon metal, oxynitrides, and a combination thereof. The fine powder component can contain a mixture of dry powder materials, which may include two or more powders of carbides, oxides, nitrides, silicon metal, and oxynitrides.

For some mixtures, the fine powder component can include silicon carbide powder. In more particular instances, the fine powder component can contain a majority content (wt % for the total weight of the fine powder component) of silicon carbide powder. In one embodiment, the fine powder component consists essentially of silicon carbide powder.

In other embodiments, the fine powder component can include a certain content of silicon nitride powder. For example, the fine powder component can contain a majority content (wt % for the total weight of the fine powder component) of silicon nitride powder. In one particular embodiment, the fine powder component can consist essentially of silicon nitride powder.

In accordance with another embodiment, the fine powder can include silicon metal powder. In fact, the silicon metal powder may be present in a majority amount (wt % for the total weight of the fine powder component) of the fine powder component. In a particular embodiment, the fine powder component can consist essentially of silicon metal powder.

In yet another embodiment, the fine powder component can include a silicon oxynitride powder. For example, the fine powder component can contain a majority amount (wt % for the total weight of the fine powder component) of silicon oxynitride powder material. In one particular instance, the fine powder component consists essentially of silicon oxynitride powder.

The fine powder component can include some content of an oxide powder. For example, the fine powder component can contain a majority amount (wt % for the total weight of the fine powder component) of silicon dioxide ($SiO_2$) powder material. In one particular instance, the fine powder component consists essentially of silicon dioxide powder. However, in other instances, the mixture can contain a minor amount of oxide material, particularly, silicon dioxide.

The mixture including the fine powder component and coarse powder component can define a mixture having a bimodal particle size distribution. That is, the fine powder component and coarse powder component define two distinct modes of particle sizes when evaluating the particle size distribution of the entire mixture.

Moreover, while the mixture is described as having a fine powder component and coarse powder component defining a bimodal particle size distribution, the mixture can include additional modes. That is, the mixture can include at least a third powder component, and can have more than three powder components. The third powder component can have a particle size that is different than the fine powder component and coarse powder component. Accordingly, the mixture can have a trimodal particle size distribution.

According to one embodiment, the mixture can include a third powder component including a material such as a metal, a carbide, an oxide, a nitride, an oxynitride, and a combination thereof. In particular instances, the third powder can include a material such as silicon metal, silicon carbide, silicon dioxide, silicon nitride, silicon oxynitride, and a combination thereof. Notably, the third powder component can include a material that is distinct from the materials utilized in the fine powder component and/or the coarse powder component.

In forming the mixture, a liquid carrier may be added to the mixture of powder components to form a slurry. Formation of a slurry may be facilitated by use of a liquid carrier including an aqueous-based liquid carrier, such as water.

The mixture, including either the dry mixture or wet mixture (i.e. slurry), can include additive components. The additive components may be present in minor amounts (wt % for the total weight of the mixture) as compared to the amounts of the fine powder component and coarse powder component. For example, the amount of the additive component can be not greater than about 20 wt %, such as not greater than about 15 wt %, not greater than about 12 wt %, not greater than about 10 wt %, not greater than about 8 wt %, or even not greater than about 5 wt % for the total weight of the mixture. Still, the mixture can be formed such that it includes at least about 1 wt %, at least about 2 wt %, or even at least about 3 wt % of an additive component. The amount of an additive component within the mixture can be within a range between any of the minimum and maximum values noted above.

Some suitable additives may include oxides, nitrides, carbides, borides, and a combination thereof. In particular instances, the mixture may contain an additive component in the form of an oxide material, and particularly, alumina. In other instances, the mixture can further include a minor amount of an additive component in the form of iron oxide. However, in certain instances, the amount of additives may be limited, such that the purity of the finally-formed article is controlled.

After forming the mixture comprising a silicon oxynitride at step 101, the process can continue at step 102 by shaping the mixture to form a green body. The process of shaping the green body can include processes such as casting, molding, pressing, extruding, injecting, and a combination thereof. In one particular instance, the shaping process can include a slip casting process, wherein the slurry is introduced into a mold, typically made of a plaster material, and the liquid of the slurry is drawn out into the mold body, leaving the solid content of the slurry to conform to the shape of the mold. After a suitable amount of time, the slurry in the mold is sufficiently dehydrated to result in a green ceramic body. For a detailed description of techniques for forming a ceramic body, attention is drawn to U.S. Pat. No. 4,990,469, incorporated herein by reference.

Shaping of the mixture to form a green body can include shaping the mixture into the form of a crucible, having an inner bowl surface and constructed to contain a liquid or powder material therein. Notably, shaping of the mixture to form the green body includes shaping of the mixture into a crucible body such that the silicon oxynitride powder component present in the initial mixture extends throughout the entire volume of the green body.

After shaping the mixture at step 102, the process can continue by firing the green body to form a sintered body. In accordance with an embodiment, firing can be conducted at a firing temperature of at least 1000° C. In other instances, the firing temperature can be greater, such as at least about 1100° C., at least about 1200° C., at least about 1300° C., or even at least about 1350° C. For certain processes, the firing temperature can be not greater than about 2000° C., such as not greater than about 1800° C., not greater than about 1700° C., not greater than about 1600° C., or even not greater than about 1500° C. It will be appreciated that the firing temperature can be within a range between any of the minimum and maximum values noted above.

During firing, the atmosphere within the chamber containing the green body can be controlled. For example, the firing process can be conducted in a firing atmosphere comprising a reducing species. Certain suitable reducing species can include nitrogen. In particular instances, firing can be conducted in an atmosphere having a majority content of nitrogen, including for example, an atmosphere that consists essentially of nitrogen.

Furthermore, the firing atmosphere can have an atmospheric pressure that can be not greater than about 3 atmospheres (0.3 MPa). In still other instances, the firing atmosphere can have an atmospheric pressure that is not greater than about 2 atmospheres, such as not greater than about 1.5 atmospheres, or even approximately 1 atmosphere.

Firing of the green body to form a sintered body can include heat treatment to facilitate densification of the green body. For example, the process of firing can include sintering the green body, which facilitates densification and grain growth. In accordance with an embodiment, the sintered body can be in the form of a monolithic crucible body having a density of at least about 70% theoretical density. In other embodiments, the sintered body may have a greater theoretical density.

The process of firing can be completed such that the sintered body forms a monolithic crucible body comprising silicon oxynitride, wherein the silicon oxynitride is incorporated into the entire body and the silicon oxynitride material extends throughout the entire volume of the monolithic crucible body. That is, the silicon oxynitride material may not necessarily be present on the body as merely a film or coating layer. Rather, the monolithic crucible body contains silicon oxynitride grains extending throughout the entire volume, which can extend throughout the entire thickness of the body. Moreover it will be appreciated that reference to a monolithic body is a body that is formed from a single material, as opposed to one formed of many separate components, such as a series of coatings or layers bonded together. Formation of a monolithic crucible body may facilitate improved wetting characteristics and thermo-mechanical properties.

According to one embodiment, the monolithic crucible body can have a porosity of at least about 5 vol % for the total volume of the monolithic crucible body. In other instances, the porosity can be greater, such as at least about 10 vol %, at least about 12 vol %, at least about 15 vol %, or even at least about 18 vol %. Still, the monolithic crucible body can be formed such that the porosity is not greater than about 40 vol %, such as not greater than about 35 vol %, not greater than about 30 vol %, not greater than about 25 vol %, or even not greater than about 20 vol %. It will be appreciated that the crucible body can contain an amount of porosity within a range between any of the minimum and maximum percentages noted above.

According to one embodiment, the monolithic crucible body can be formed such that at least about 20 vol % of the total volume of the monolithic crucible body comprises silicon oxynitride. In other embodiments, the monolithic crucible body includes at least 30 vol %, such as at least 40 vol %, at least about 50 vol %, or even at least about 55 vol % silicon oxynitride for the total volume of the monolithic crucible body. Still, in accordance with an embodiment, the monolithic crucible body can contain not greater than about 99 vol % silicon oxynitride, or even on the order of not greater than about 95 vol %, not greater than about 90 vol %, not greater than about 85 vol %, or even not greater than about 75 vol % silicon oxynitride for the total volume of the crucible body. It will be appreciated that the crucible body can contain an amount of silicon oxynitride within a range between any of the minimum and maximum percentages noted above.

It will be appreciated that the monolithic crucible body can be a composite material including a second material in addition to the silicon oxynitride. The second material can include a distinct phase of material formed from a second powder component added to the original mixture. As such, the second material can include materials such as nitrides, carbides, oxides, and a combination thereof. In particular embodiments, the second material can include silicon nitride, silicon carbide, silicon metal, and a combination thereof.

It will be appreciated that the second material contained within the monolithic crucible body can be present in an amount (vol %) that is less than the amount of silicon oxynitride within the monolithic crucible body. In one particular embodiment, the second material may be present in an amount (vol %) that is substantially the same as the amount of silicon oxynitride present within the monolithic crucible body. Still, certain crucible bodies can be formed, wherein the amount (vol %) of the second material within the monolithic crucible body can be greater than the amount of silicon oxynitride present within the monolithic crucible body.

In accordance with embodiments herein, the monolithic crucible body can contain a significant content of crystalline phase for the total volume of the monolithic crucible body. That is, the crucible body can contain a minor amount of amorphous phase material, and in particular, may be essentially free of amorphous phase content. For example, in one embodiment, the crucible body can be formed such that it contains at least 90 vol % crystalline phase content for the total volume of the crucible body. In other instances, the crystalline content can be greater, such that it is at least about 95 vol %, at least about 97 vol %, or such that the body consists essentially of only crystalline phase material.

The crucible body can include minor amounts of certain materials, including for example, aluminum (Al). For example, the crucible body can include not greater than about 5 vol % aluminum for the total body of the crucible. In other instances, the amount of aluminum may be less, such as not greater than about 3 vol %, not greater than about 2 vol %, or even not greater than about 1 vol %. According to one embodiment, the crucible body can be essentially free of aluminum.

It should be noted that various formulations of silicon oxynitride can exist. In accordance with one embodiment, the silicon oxynitride present within the crucible body can be in the form of $Si_2N_2O$. In fact, the silicon oxynitride present within the crucible body can consist essentially of $Si_2N_2O$.

The crucible body may have particular mechanical properties. For example, the Young's Modulus of the crucible body can be not greater than about 250 GPa. Young's Modulus may be measured by standard techniques, including for example, sonic techniques based on ASTM 1876. In other instances, the Young's Modulus of the crucible body can be not greater than about 200 GPa, such as not greater than about 180 GPa, or even not greater than about 150 GPa. Still, the crucible body can be formed such that the Young's Modulus is at least about 10 GPa, such as at least about 25 GPa, or even at least about 50 GPa.

In further reference to certain mechanical characteristics, the crucible body can be formed such that it can have a shear modulus (G) that is not greater than about 100 GPa. Shear modulus can be measured using suitable techniques known in the art, including for example, according to ASTM D4027-D4. In certain other instances, the crucible body can have a shear modulus that is not greater than about 90 GPa, such as not greater than about 80 GPa, or even not greater than about 70 GPa. In accordance with an embodiment, the crucible body can have a shear modulus that is at least about 5 GPa, such as at least about 10 GPa, at least about 15 GPa, or even at least about 20 GPa. It will be appreciated that the crucible body can have a shear modulus within a range between any of the minimum and maximum values noted above. It will be appreciated that the crucible body can have a Young's Modulus within a range between any of the minimum and maximum values noted above.

In certain instances, the crucible body can be formed to have a particular coefficient of thermal expansion ($CTE_c$). For example, the crucible body can have a coefficient of thermal expansion that is not greater than about $3.00 \times 10^{-6}$ 1/° C. during heating from 20° C. to 200° C. In other instances, the crucible body can have a coefficient of thermal expansion that is not greater than about $2.9 \times 10^{-6}$ 1/° C., such as not greater than about $2.88 \times 10^{-6}$ 1/° C. from 20° C. to 200° C. Still, the crucible body can be formed such that the coefficient of thermal expansion is at least about $2.00 \times 10^{-6}$ 1/° C., such as at least about $2.20 \times 10^{-6}$ 1/° C., at least about $2.40 \times 10^{-6}$ 1/° C., at least about $2.60 \times 10^{-6}$ 1/° C., or even at least about $2.75 \times 10^{-6}$ 1/° C. from 20° C. to 200° C. It will be appreciated that the crucible body can have a coefficient of thermal expansion within a range between any of the minimum and maximum values noted above.

In other exemplary embodiments, the crucible body can be formed such that it has a coefficient of thermal expansion ($CTE_c$) designed to have a particular difference as compared to the coefficient of thermal expansion of another material. In particular, the crucible body can have a difference in coefficient of thermal expansion ($\Delta CTE$) between the coefficient of thermal expansion of the crucible body and a coefficient of thermal expansion of metal silicon ($CTE_s$), which may be defined by the equation $\Delta CTE=[(CTE_c-CTE_s)/CTE_s]$.

According to one embodiment, the crucible can be formed such that can have a difference in coefficient of thermal expansion ($\Delta CTE$) that is not greater than about 20%. In other instances, the difference in coefficient of thermal expansion can be less, such as not greater than about 18%, not greater than about 16%, not greater than about 14%, not greater than about 12%, not greater than about 10%, or even not greater than about 9.5%. Still, the difference in coefficient of thermal expansion ($\Delta CTE$) can be at least about 2%, such as at least about 4%, at least about 6%, at least about 7%, or even at least about 8%. Notably, the difference in coefficient of thermal expansion can be within a range between any of the minimum and maximum percentages noted above.

Figure 2:
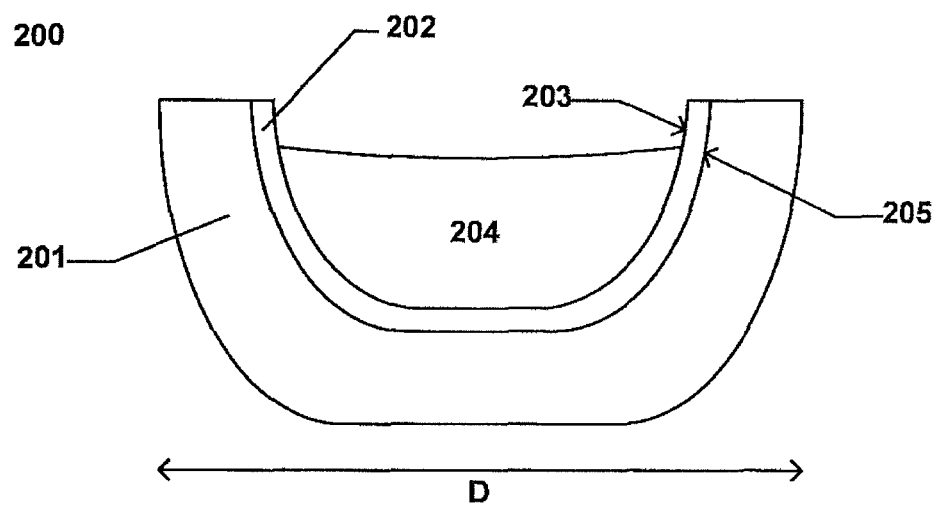
FIG. 2 includes a cross-sectional illustration of a crucible body in accordance with an embodiment.

Referring again to FIG. 1, after firing the green body at step 103, the process can continue with an optional step 105, including forming a coating layer over an external surface of the sintered body. Application of the coating may facilitate less particle generation, improved wetting characteristics, and improved thermo-mechanical properties. Referring to FIG. 2, a cross-sectional illustration of a crucible is provided. As illustrated, the crucible 200 includes a crucible body 201 and a coating 202 overlying an external surface of the body 201. In particular, the coating layer 202 can define an exterior surface 203 of the crucible 200. In particular, the coating layer 202 can overlie an inner bowl surface 205 of the crucible body 201. The coating layer 202 can be configured to be in direct contact with the material 204 contained within the crucible during processing.

The coating layer can be formed by suitable deposition techniques. For example, the coating layer 202 may be applied by spraying, brushing, dipping, or a combination thereof. Moreover, while FIG. 2 illustrates a coating layer 202 as overlying the inner bowl surface 205 of the crucible body 201, it will be appreciated that the coating layer can overlie a greater percentage of the external surface area of the crucible body 201. For example, the coating layer 202 may extend over the entire surface of the crucible body 201.

In accordance with an embodiment, the coating layer can include a material such as a carbide, nitride, oxide, boride, oxynitride, and a combination thereof. In particular instances, the coating layer 202 can include silicon, such as a silicon-containing compound, and more particularly, silicon nitride. In one exemplary crucible, the coating layer 202 may consist essentially of silicon nitride.

According to another embodiment, the coating layer 202 can include silicon oxynitride. In fact, one crucible according to embodiments herein comprises a coating layer 202 consisting essentially of silicon oxynitride.

The coating layer 202 can contain a higher concentration of silicon oxynitride as compared to the concentration of silicon oxynitride within the crucible body 201. That is, for example, the amount of silicon oxynitride present within the coating layer 202 can be at least about 5% greater than the amount of silicon oxynitride within the entire volume of the crucible body 201. In other instances, the difference in the amount of silicon oxynitride present within the coating layer 202 as compared to the crucible body 201 can be greater, such as that it is at least about 10 vol % greater, at least about 15 vol % greater, at least about 20 vol % greater, at least about 30 vol % greater, or even at least about 40 vol % greater as compared to the amount of silicon oxynitride within the crucible body.

According to certain embodiments, the coating layer 202 can have a porosity that is significantly less than a porosity of the crucible body 201. For example, the coating layer can have a porosity that is not greater than about 25 vol % for the total volume of the coating layer 202. In other instances, the porosity of the coating layer can be less, such as not greater than about 20 vol %, not greater than about 15 vol %, not greater than about 10 vol %, not greater than about 5 vol %, or even not greater than about 3 vol %.

According to one embodiment, the coating layer can have an average thickness of not greater than about 10 mm. In other embodiments, the average thickness of the coating layer 202 can be less, such that it is not greater than about 8 mm, not greater than about 5 mm, not greater than about 3 mm, or even not greater than about 2 mm. Still, the coating layer can have an average thickness that is at least about 0.01 mm, such as at least about 0.05 mm, at least about 0.1 mm, at least about 0.5 mm, or even at least about 1 mm. It will be appreciated that the coating layer 202 can have an average thickness within a range between any of the minimum and maximum values noted above.

The process of forming the crucible as noted herein can facilitate construction of large size crucibles which may be reused when processing molten silicon. Generally, within the industry, certain crucibles may be used a single time to facilitate melting of silicon since such a process may require breaking of the crucible to remove the silicon material after melting. The crucible, according to embodiments herein, can be manufactured and constructed to have a combination of features including a monolithic construction, particular combination of material phases (e.g., silicon oxynitride, silicon carbide, silicon nitride, and silicon), distribution of material phases, amount of material phases, low amorphous phase content, and a coating layer that facilitate improved performance when processing of molten materials, such as silicon metal. Certain improved parameters can include reduced particle generation, lower chemical reactivity, improved thermo-mechanical properties including reduced cracking and controlled coefficient of thermal expansion.

Moreover, the combination of materials and processes provided in the embodiments herein can facilitate the formation of large size crucibles that can contain and process greater amounts of materials. For example, the crucible can have a diameter (D) that is at least about 0.25 meters. In other instances, the crucible can be greater, such that the diameter (D) is at least about 0.5 meters, such as at least 0.75 meters, or even at least 1 meter. Formation and utilization of such crucibles provides efficacy and reusability to an industry which is typically by single use crucible materials.

In particular instances, the monolithic crucible body can include a composite material including a second material in addition to the silicon oxynitride material. Notably, the body can contain a greater content of the second material than the silicon oxynitride. According to one embodiment, the second material can include silicon nitride ($Si_3N_4$), and may consist essentially of silicon nitride. For at least one embodiment, the body can be characterized by a ratio of silicon oxynitride to silicon nitride [$Si_2ON_2/Si_3N_4$] of at least about 0.10. In other embodiments, the ratio can be at least about 0.12, such as at least about 0.15, at least about 0.2, at least about 0.23, at least about 0.25, or even at least about 0.27. Still, in one non-limiting embodiment, the ratio can be not greater than about 0.7, such as not greater than about 0.6, not greater than about 0.55, or even not greater than about 0.5. It will be appreciated that the ratio can be within a range between any of the minimum and maximum values noted above.

Additionally, the monolithic crucible body can be made of a composite according to embodiments herein that can include a third material comprising an oxide, such as silica ($SiO_2$). In particular instances, the body can have a greater content of silicon oxynitride than the third material. Moreover, the body may contain a greater content of a second material comprising a nitride, such as silicon nitride, than the third material. For example, the body may contain silicon nitride and silica, wherein the content of silicon nitride is greater than the content of silica.

In at least one embodiment, the body made of the composite material can include a particular content of the third material. For example, the body can have not greater than about 12 vol % of the third material for the total volume of the body. In still other instances, the body can include not greater than about 10 vol %, such as not greater than about 9 vol %, not greater than about 8 vol %, not greater than about 7 vol %, not greater than about 6 vol %, or even not greater than about 5 vol %. Still, in one non-limiting embodiment, the body can contain at least about 0.5 vol %, such as at least about 1 vol %, at least about 1.5 vol %, or even at least about 2 vol % of the third material. It will be appreciated that the content of the third material in the body can be within a range between any of the minimum and maximum values noted above.

Additionally, the third material can be present in different phases, including for example, a crystalline phase, a vitreous phase, and a combination thereof. For certain compositions, the third material can have a greater content of the vitreous phase than a content of the crystalline phase. In one particular embodiment, the amount of crystalline phase and vitreous phase within the third material may be characterized as a ratio of vitreous phase to crystalline phase [Pvit/Pcry], having a value of not greater than about 0.45. In more particular embodiments, the ratio can be not greater than about 0.40, such as not greater than about 0.37, not greater than about 0.33, not greater than about 0.3, or even not greater than about 0.28. Still, in at least one non-limiting embodiment, the ratio may be at least about 0.01.

According to one composition of an embodiment, the crystalline phase of the third material may be present in an amount of not greater than about 5 vol % for the total volume of the body. In still other embodiments, the amount of the crystalline phase of the third material can be less, such as not greater than about 4 vol %, not greater than about 3 vol %, or even not greater than about 2 vol %. In particular instances, the third material can be essentially free of a crystalline phase. In an alternative embodiment, the third material may be essentially free of an amorphous phase. Moreover, in one embodiment, the body can be essentially free of a third material, and particularly, silica.

EXAMPLES

Example 1

A mixture is formed from the materials identified below in Table 1. Initially, a dry mixture is formed of the coarse silicon oxynitride powder ($Si_2ON_2$ (Coarse)) having an average particle size of approximately 150 microns and the fine silicon oxynitride powder ($Si_2ON_2$ (Fine)) having an average particle size of approximately 1 micron. After sufficiently mixing the two powder materials, additives and silicon metal are included and mixing is continued. The mixture is dried, sieved, and moved to a treatment zone where it is heated to a volatilization temperature of approximately 600° C. to remove organic materials. The mixture is then heat treated in a firing zone at a temperature of approximately 1440° C. in an atmosphere consisting essentially of nitrogen for about 60 hours. The result of the process is a monolithic, crucible body comprising silicon oxynitride material extending throughout the body.

Notably, metal silicon is melted in the crucible for processing in electronics industry. The silicon is melted in an acceptable manner and is released from the crucible body without damage to the crucible body, such that the crucible can be reused in a second, consecutive melting process.

TABLE 1

| Material | Amount | Amount (wt %) |
|---|---|---|
| $Si_2ON_2$ (Coarse) | 35.4 | 26 |
| $Si_2ON_2$ (Fine) | 33.3 | 24 |
| Silicon | 15 | 11 |
| Additives | 0.05 | 0.04 |
| Water | 54 | 39 |

Example 2

Five samples, S1A, S2B, S3C, S4D, and S5E are made according to embodiments herein. Sample S1A is made the same as the sample of Example 1, except that the body was fired at the maximum firing zone temperature for approximately twice as long as in Example 1.

Sample S2B and S2E are made according to Example 1.

Sample S3C is made according to Example 1 except that nitrogen is immediately introduced during treatment instead of in the firing zone, thus the sample is exposed to additional nitrogen atmosphere, when it initially enters the treatment zone.

Sample S4D is made according to Example 1 except that it is made, treated and fired in standing furnace. Nitrogen is immediately introduced during heating (i.e., treatment and firing), thus the sample is exposed to additional nitrogen as compared to Example 1.

The CTE of each of the samples is measured upon cooling from 1400° C. to 100° C. Furthermore each of the samples is analyzed via X-ray using Reitfield analysis to determine the crystalline content and materials present. Samples S2B and S3C were characterized via LECO analysis to determine the amorphous content of the composite samples. The results of the testing are summarized in Table 2.

TABLE 2

| | CTE (×10−6) | XRD Analysis | | LECO Analysis | |
|---|---|---|---|---|---|
| Sample | (cooling: 1400° C.-100° C.) | % $Si_2ON_2$ | % $Si_3N_4$ | % $SiO_2$ (Crystalline) | % Amorphous |
| S1A | 3.65 | 31.2 | 63.4 | 1.2 | |
| S2B | 3.67 | 33.6 | 59.1 | 1.3 | 5.6 |
| S3C | 3.76 | 33.8 | 59.2 | 1.4 | 7 |
| S4D | 3.88 | 9.7 | 90.3 | 0 | |
| S5E | 3.45 | 22.8 | 75 | 0 | |

As is evident from the data of Tables 2 and 3, each of the compositions had suitable CTEs upon cooling to function as reusable crucibles in silicon metal processing.

In the foregoing, reference to specific embodiments and the connections of certain components is illustrative. It will be appreciated that reference to components as being coupled or connected is intended to disclose either direct connection between said components or indirect connection through one or more intervening components, as will be appreciated, to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The disclosure is submitted with the understanding that it will not be used to interpret or limit the scope or meaning of the claims. In addition, in the foregoing disclosure, various features may be grouped together or described in a single embodiment for the purpose of streamlining the disclosure. This disclosure is not to be interpreted as reflecting an intention that the embodiments herein limit the features provided in the claims, and moreover, any of the features described herein can be combined together to describe the inventive subject matter. Still, inventive subject matter may be directed to less than all features of any of the disclosed embodiments.

What is claimed is:

1. An article comprising:
  a monolithic crucible body comprising silicon nitride and at least about 22 vol % of silicon oxynitride ($Si_xN_yO$, wherein x>0 and y>0), wherein the silicon oxynitride extends throughout the entire volume of the monolithic crucible body, and the body comprises a ratio of silicon oxynitride to silicon nitride [$Si_2ON_2/Si_3N_4$] of not greater than about 0.7.

2. The article of claim 1, wherein the monolithic crucible body comprises a composite material including a third material in addition to the silicon nitride and silicon oxynitride.

3. The article of claim 2, wherein the monolithic crucible body comprises a greater content of the third material than the silicon nitride and silicon oxynitride.

4. The article of claim 1, wherein the monolithic crucible body comprises a third material comprising an oxide.

5. The article of claim 4, wherein the third material comprises silica ($SiO_2$).

6. The article of claim 4, wherein the body comprises not greater than about 12 vol % of a third material for the total volume of the body.

7. The article of claim 1, wherein the monolithic crucible body comprises a third material, and the third material comprises at least one of a crystalline phase, a vitreous phase, and a combination of a vitreous phase and a crystalline phase.

8. The article of claim 7, wherein the body comprises a ratio of vitreous phase to crystalline phase of the third material [Pvit/Pcry] of not greater than about 0.45.

9. The article of claim 7, wherein the body comprises a crystalline phase of not greater than about 5 vol % for the total volume of the body.

10. The article of claim 1, wherein the monolithic crucible body comprises at least about 81 wt % of one or more compounds including silicon and nitrogen atoms.

11. The article of claim 1, wherein the [$Si_2ON_2/Si_3N_4$] is at least 0.10.

12. The article of claim 1, wherein the monolithic crucible body comprises not greater than about 5 vol % aluminum.

13. The article of claim 1, wherein the monolithic crucible body comprises a porosity of at least about 5 vol %.

14. The article of claim 1, wherein the monolithic crucible body comprises a coefficient of thermal expansion ($CTE_c$) of not greater than about $3.00 \times 10^{-6}$ 1/° C. from 20° C. to 200° C.

15. The article of claim 1, wherein the monolithic crucible body comprises a coefficient of thermal expansion ($CTE_c$) of at least about $2.00 \times 10^{-6}$ $1/°$ C. from 20° C. to 200° C.

16. The article of claim 1, further comprising a coating layer overlying an external surface of the monolithic crucible body.

* * * * *